United States Patent
Agarwal et al.

(10) Patent No.: US 7,424,691 B2
(45) Date of Patent: Sep. 9, 2008

(54) METHOD FOR VERIFYING PERFORMANCE OF AN ARRAY BY SIMULATING OPERATION OF EDGE CELLS IN A FULL ARRAY MODEL

(75) Inventors: Vikas Agarwal, Austin, TX (US); Michael Ju Hyeok Lee, Austin, TX (US); Philip G. Shephard, III, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 358 days.

(21) Appl. No.: 11/279,312

(22) Filed: Apr. 11, 2006

(65) Prior Publication Data

US 2007/0245279 A1    Oct. 18, 2007

(51) Int. Cl.
*G06F 17/50* (2006.01)
*G11C 29/00* (2006.01)

(52) U.S. Cl. .......................................... 716/6; 365/201
(58) Field of Classification Search ................. None
See application file for complete search history.

(56) References Cited

U.S. PATENT DOCUMENTS

| | | | |
|---|---|---|---|
| 5,392,227 A | | 2/1995 | Hiserote |
| 6,185,723 B1 * | | 2/2001 | Burks et al. .................. 716/6 |
| 6,650,592 B2 * | | 11/2003 | Amatangelo et al. ... 365/233.16 |
| 6,813,201 B2 * | | 11/2004 | Zarrineh et al. ............. 365/201 |
| 2003/0037306 A1 | | 2/2003 | Gutwin, et al. |
| 2003/0115035 A1 | | 6/2003 | Kulshreshtha et al. |
| 2003/0163297 A1 | | 8/2003 | Khaira, et al. |
| 2004/0162716 A1 | | 8/2004 | Dorfman et al. |
| 2005/0273208 A1 | | 12/2005 | Yazawa et al. |
| 2007/0044049 A1 | | 2/2007 | Adams et al. |

OTHER PUBLICATIONS

U.S. Appl. No. 11/077,313, filed Mar. 10, 2005, Joshi et al.
U.S. Appl. No. 11/225,652, filed Sep. 13, 2005, Joshi et al.
U.S. Appl. No. 11/250,019, filed Oct. 13, 2005, Joshi et al.
U.S. Appl. No. 11/250,061, filed Oct. 13, 2005, Kuang et al.
U.S. Appl. No. 11/225,571, filed Sep. 13, 2005, Joshi et al.

* cited by examiner

*Primary Examiner*—Leigh Marie Garbowski
(74) *Attorney, Agent, or Firm*—Mitch Harris, Atty at Law, LLC; Andrew M. Harris; Casimer K. Salys

(57) ABSTRACT

A method for verifying performance of an array by simulating operation of edge cells in a full array model reduces the computation time required for complete design verification. The edge cells of the array (or each subarray if the array is partitioned) are subjected to a timing simulation while the center cells of the array are logically disabled, but remain in the circuit model, providing proper loading. Additional cells are specified for simulation if calculations indicate a worst-case condition due to a non-edge cell. Wordline arrivals are observed to determine worst-case rows for selection. For write operations, the difference between the wordline edges and the data edges is used to locate any non-edge "outlier" cells. For read operations, the wordline delays are summed with the bitline delays determined from edge column data to locate any outliers.

7 Claims, 4 Drawing Sheets

METHOD FOR VERIFYING PERFORMANCE OF AN ARRAY BY SIMULATING OPERATION OF EDGE CELLS IN A FULL ARRAY MODEL

BACKGROUND OF THE INVENTION

1. Field of the Invention

The present invention is related to circuit simulation and verification methods and software, and more particularly to array modeling methods and software that verify performance of the array.

2. Description of Related Art

Full circuit simulation is not typically performed by simultaneously modeling each cell in an array during design verification. Since the amount of computation time and memory required increases geometrically with the array dimension, timing analysis is usually performed by using lumped parameter models for inactive cells during a particular timing pass. The use of a model for the inactive cell loading effect reduces the accuracy of the simulation, and in high speed memory designs leads to less than ideal designs and over-specified margins.

The worst-case read performance of an array (or sub-array if the array is partitioned) is typically dictated by cells along the edges of the array, since the worst-case arrival time delay of the wordline from the boundary of the array and the worst-case propagation time from the output of the cell pass device(s) to the output circuit, generally a read circuit, will always have a shortest and longest value located at opposing corners of the array. Since an array is defined by the progression of wordlines along one edge and bit-lines along the other the corner cell corresponding to the shortest bitline and wordline should have the minimum delay and the opposite corner, the maximum delay.

However, since the wordline driver circuits have non-uniform delay, the worst-case read delay values (both min and max) can occur anywhere along the edges of the array. Further, if the read circuits are non-uniform or have non-uniform paths to a downstream point at which they must be timed, then the worst-case read delay values could occur at any cell within the array. Both min and max delays are critical in designs that are timed to provide the shortest consecutive read cycles, because the data cannot be timed to arrive too early or too late.

Since the write performance is dependent on the relative arrival of both a data value on a bitline and a strobe value on a wordline, the worst-case write conditions also do not always occur at the edge of the array, since the worst-case word line and data bitline delay from their respective driver circuits can occur at any combination of row and column.

Simulation of each cell in an array is a time-consuming process, as in current analysis software, each propagation of signals within a cell typically requires full execution of the simulation code for each cell unless the cell is completely removed from the model, which is why the above-mentioned lumped-parameter model technique is often used. Some attempts have been made to model arrays by removing all of the cells except for the edge cells. However, as noted above, write failures can be missed due to the dependence of a successful write on the relative arrival of the strobe and data value. Further, removal of all of the center cells alters the bitline and wordline loading, resulting in timing deviations that can miss write failures and potentially read failures.

Such reduction is extremely desirable, since full simulation of an J by K array has a computation time of the cell computation time multiplied by J*K, in essence an N-squared burden as array dimension increases. Full simulation of only the edge cells requires only 2*(J+K)−4, which is an N-order computational burden as array dimension increases.

Therefore, it would be desirable to provide a design verification method for arrays that can reduce the analysis time while accurately verifying read and write performance of an entire array.

SUMMARY OF THE INVENTION

The above objectives of verifying read and write performance of an entire array with reduced computation time is achieved in a computer-performed verification method.

The method may be embodied in a computer system executing program instructions for carrying out the steps of the method and may further be embodied in a computer program product containing program instructions in computer-readable form for carrying out the steps of the method.

The method fully simulates only edge cells of an array (or each sub-array if present) using transistor-level simulation, which may include static timing analysis checks. The cells within the center of the array are left in the model to provide loading measurement, but computation of the operation within the cell is disabled so that loading effects are present.

In addition to simulation of the edge cells, which will generally reveal the worst-case read timings and margins, the arrival of the wordline and bitline edges are detected at each cell of the array (or each sub-array if present) and an arrival difference value computed for each cell. If any of the arrival differences for the center cells are greater than the greatest arrival difference or less than the least arrival difference among the edge cells, then those center cells having greater or lower arrival differences are also fully simulated in order to find the worst-case write timings and margins.

If wordline absolute arrival times are non-uniform and/or the downstream read delay values have critical timing differences from the boundary of the array, then one or more additional rows may also need to be further simulated to determine the shortest or longest read delay. The arrival time of the wordline edges can be observed at a particular column (generally an edge column), and the read delay at the read circuits determined from the bitline read propagation differences as timed from one of the simulated edge columns. The sum of the wordline delay and the read delay is computed for each cell and compared to the shortest and longest read delay for the edge cells. If any of the computed read delays are greater than the longest or less than the shortest read delay for the fully simulated row edge cells, then the row(s) containing those cells are fully simulated in order to find the worst-case read timings and margins.

The foregoing and other objectives, features, and advantages of the invention will be apparent from the following, more particular, description of the preferred embodiment of the invention, as illustrated in the accompanying drawings.

DETAILED DESCRIPTION OF PREFERRED EMBODIMENT

Figure 1:
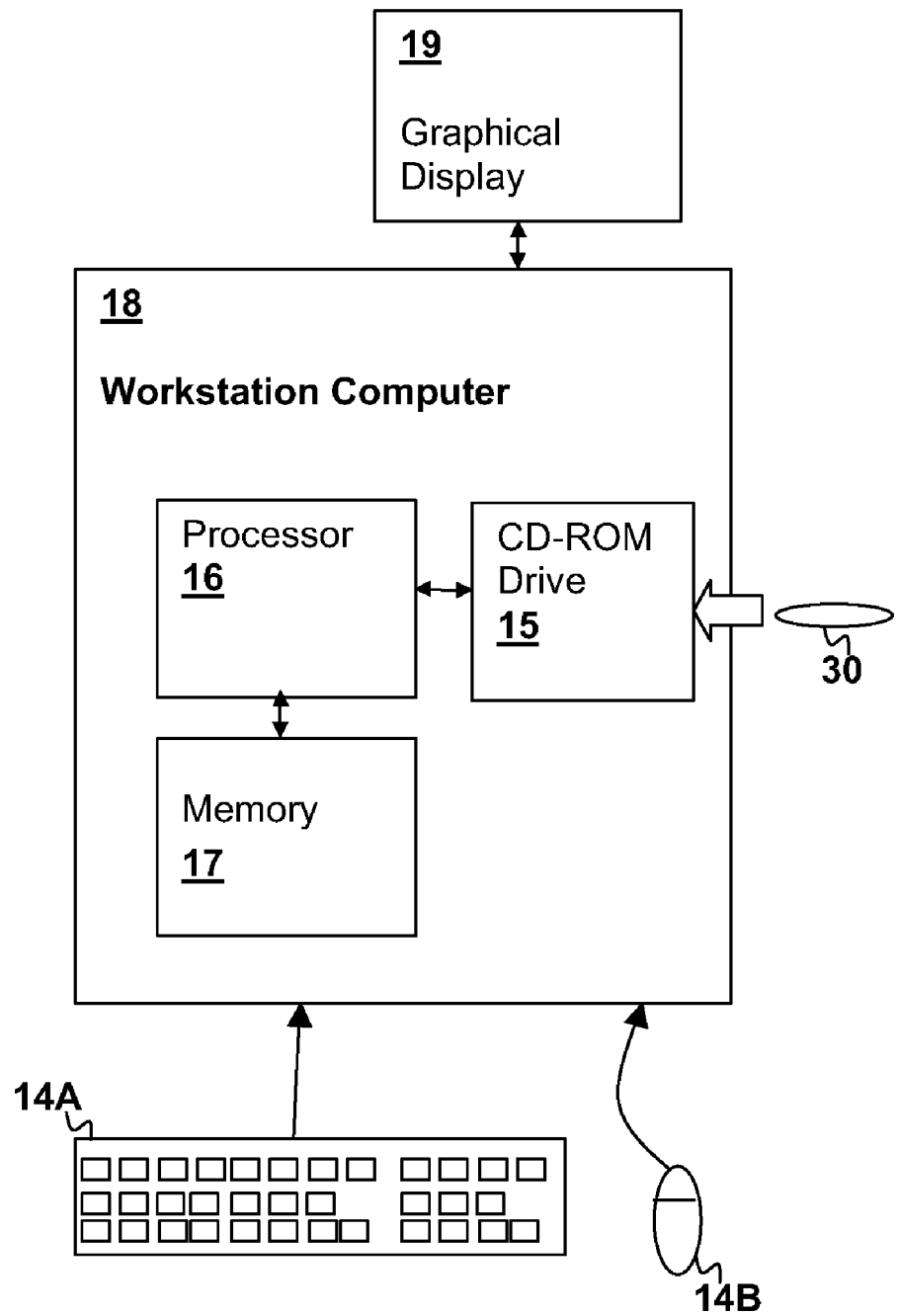
FIG. 1 is a pictorial diagram of a workstation computer system in which methods in accordance with an embodiment of the present invention are performed.

The present invention concerns a computer-performed design verification method and computer program for carrying out the method. The program may be a dedicated program having program instructions in accordance with an embodiment of the present invention, or an existing design tool such as one of the variety of programs, such as "Simulation Program with Integrated Circuits Emphasis" (SPICE—originally a development of the University of California, Berkeley) can be employed. The particular simulation program must be modified or include specific operation directed as detailed herein below by accepting simulation input directives that can logically disable devices within a cell. The simulation results may then be used to provide input to a static timing analysis tool such as EINSTIMER (a product of International Business Machines Corporation).

The method of the present invention dramatically reduces the amount of time to perform a full circuit level verification of array read delay and margin, and write performance (i.e., whether each cell in the array will be guaranteed to accept a change in state) over specified timings and margins. Further, fabrication variation can be included via Monte-Carlo directed simulation or other techniques. The reduction in verification time is accomplished by transistor-level simulation of only the "donut" of edge cells of the array (the ring of cells of one cell deep around the array), rather than all cells in the array. The edge cell simulation is guaranteed to capture the worst-case absolute timing of the bitline (data) and wordline (read and write strobe) signals within the array, by definition of the simulated array as the smallest array unit having a monotonic trend in distribution delay of the wordline and bitline signals. Therefore, if a memory such as a static random access memory (SRAM) or other device includes sub-arrays, for example, where the wordlines are driven from the center of an array, then each sub-array is simulated to ensure predictable absolute delay behavior.

Verification of only the edge cells would capture the worst-case read condition and worst-case conditions of array writeability. However, on a write the nature of the relative timing difference between edges of the wordline signal and the bitline data signal(s) in and out of each cell is the determining factor of whether the cell will write correctly or present read data within a certain window. Due to delay differences between the wordline edges and data edges at the boundaries of the array, the worst-case write conditions may not occur at an edge cell at all. Further, for non-uniform read output circuit paths and non-uniform wordline delays, the delay differences between the wordline edges at the boundary of the array and the read output path non-uniformity can cause the worst-case read conditions to occur from cells that are not along an edge of the array.

Therefore, full simulation of only the edge cells will not always reveal whether the entire array is writeable or have the proper read delay and margins.

To overcome the above-described limitation for writeability, the method and computer program of the present invention perform a secondary check on only the relative timing of the edges of the wordline and bitline signals at each cell that determines whether any of the cells in the center of the donut are "outliers" that can cause array failure. Any cell determined to have a difference between the edges that is greater than or less than the maximum and minimum differences among the edge cells, respectively, is then fully simulated in a supplemental simulation, which may be a re-simulation of the collection of edge cells and outliers or may simulate the newly-found outliers alone.

To overcome the above-described limitation for read delay, the method and computer program of the present invention perform a secondary check on only the relative timing of the edges of the wordline signals at a particular column in the array summed with the relative bitline-to-read-circuit delay, which can generally be determined from any column(s) in the array chosen as a reference column(s). The cells having the least and greatest of the sum of wordline edge arrival delay and bitline-to-read-circuit delay are found across all the cells in the array, and if those cells are not located in rows at edges of the array, then corresponding non-edge rows are simulated in a supplemental simulation (or added to the supplemental cells collected for the write qualification described above), which may be a re-simulation of the collection of edge cells and additional rows and outliers found in the secondary write check or an additional supplemental simulation.

Referring now to FIG. 1, a workstation computer 18 having a processor 16 coupled to a memory 17, for executing program instructions from memory 17 is shown, wherein the program instructions include program instructions for executing one or more methods in accordance with an embodiment of the present invention. A CD-ROM drive 15 is also coupled to processor 16 for transfer of program products from media such as CD-ROM 30 that contain program instructions for executing methods in accordance with embodiments of the present invention.

Workstation computer 18 is also coupled to a graphical display 19 for displaying program output such as the timing information, margin and pass/fail values computed by embodiments of the present invention. Workstation computer 18 is further coupled to input devices such as a mouse 14B and a keyboard 14A for receiving user input. Workstation computer may be coupled to a public network such as the Internet, or may be a private network such as the various "intra-nets" and software containing program instructions embodying methods in accordance with embodiments of the present invention may be located on remote computers or locally within workstation computer 18.

Figure 2:
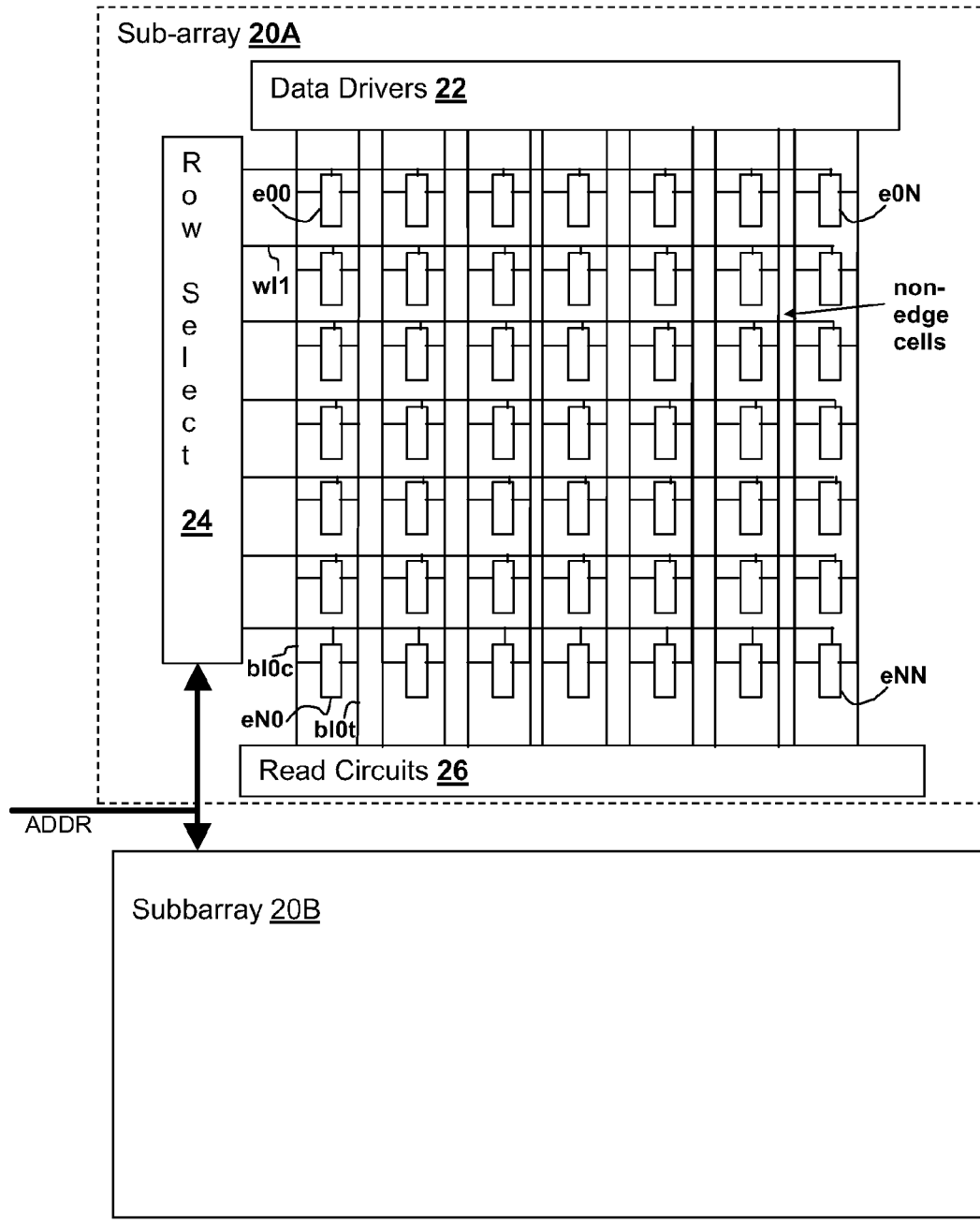
FIG. 2 is a block diagram of an array of cells in an array design model in accordance with an embodiment of the present invention.

Referring now to FIG. 2, an array device, such as an exemplary SRAM array is depicted. Two identical sub-arrays 20A and 20B are shown, with detail only for sub-array 20A. However, an actual device might include more than two sub-arrays. The exemplary array is a center driven array, with individual row select circuits 24 that drive wordline strobes onto wordlines, e.g., wl1. The edge cells are enumerated e00 through eNN for illustrative purposes. With respect to the wordline signal edges, the longest delay will occur at one of cells e[i]N, where i ranges from 0 to N, the dimension of sub-array 20A. In a read operation, read circuits 26 detect the states of bitlines, e.g. bitlines bl0c and bl0t, and the read performance is determined by how quickly any cell from e00 through eNN can produce the correct data through read circuits 26 in response to assertion of a corresponding wordline, e.g., wl1.

Generally, given a uniform output read circuit and equalized path to any clock-qualified point accepting the output of the read circuit, the worst-case read delay values will appear at the edges of the array in rows corresponding to the earliest and latest wordline edge arrivals. However, if the output read circuit paths are non-uniform to a critical timing point, then the worst-case read delay values can occur anywhere in those rows, which may or may not be edge rows. Together the worst-case delays dictate the timing between the start and end of read cycles.

For a write, the bitline data values are imposed on bitlines, e.g. bitlines bl0*c* and bl0*t*, by data drivers 22 and the longest delay for the bitline signal edges will occur at row N. Thus the longest absolute delay with respect to both bitline and wordline signals will occur at cell eNN and the shortest absolute delay at cell e00. However, since it is the difference between the arrivals of the bitline and wordline edges that determines the writeability and timing margin of each cell, the worst-case differential timing values within the array itself will generally occur in the vicinity of corner cells eN0 and e0N, but not necessarily at those corners, since row select 24, data drivers 22 and all of the signal paths play a part in the differential delay between bitlines and wordlines.

All edge cells of the array must be simulated to obtain the worst-case absolute timing for the array, and the worst-case differential timing (and thus the writeability) can only be determined by considering all of the cells of the array, including the non-edge cells within the dotted line. Also, the read delay can only be determined by considering the rows with the earliest and latest wordline arrivals, unless uniform timing can be assumed downstream of the bitlines to any critical point.

Further, the distributed loading effects of each cell must be considered in order to accurately predict timing of wordline and bitline edges at each cell. Therefore, for accurate timing results, at least an accurate loading effect including all cells must be included in the simulation analysis. As mentioned above, lumped-parameter models for the loading do not provide sufficiently accurate results.

The method of the present invention ensures that accurate timing is captured by leaving all cells in the array in the simulation model, but disables internal signal paths in the non-edge cells via directives in the simulation model for the non-edge cells. The signal paths that are disabled are all input and output paths to and from the disabled cells. The transistor-level simulation is then performed with only the edge cells contributing significantly to the computational burden, since the disabling of the internal signal paths causes the internal behavior of the cells to not be simulated and, leaving only the distributed loading effects on the bitlines and wordlines from the disabled cells.

After simulation, the differential arrival of the bitline and wordline edges are observed for the entire array to determine whether another simulation is necessary to simulate those cells in the non-edge portion of the array to verify writeability. If any non-edge cells are found that need simulation, then those cells are simulated by the transistor-level simulation and optional timing analysis checks. Also, the worst-case wordline arrivals are checked at a reference column and any non-edge rows corresponding to the worst-case wordline arrivals are also simulated by the transistor-level simulation and optional timing analysis checks.

Also after simulation, the timed wordline arrivals are summed with the progressive bitline delays determined from one or both of the edge columns for each cell in the array to determine whether the greatest or least total read delay for the wordline select through the read circuits lies within the set of non-edge cells. If so, those cells are also simulated by the transistor-level simulation and optional timing analysis checks.

Figure 3A:
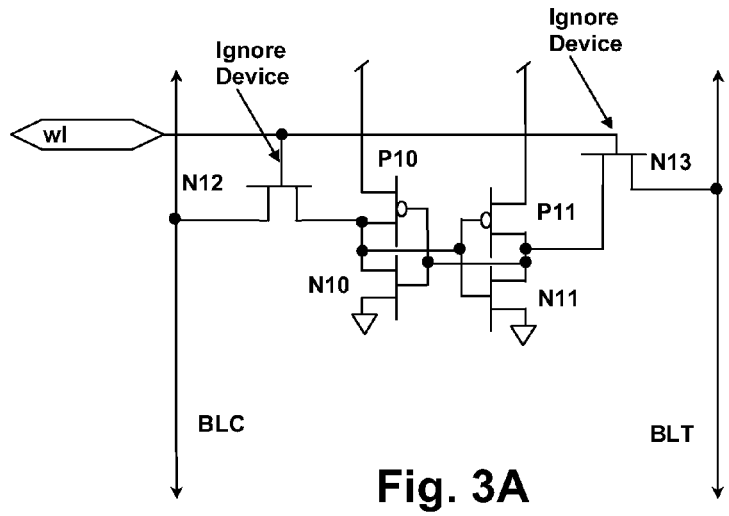
FIGS. 3A and 3B are schematic diagrams of cell as may be deployed within the array design of FIG. 2.

Referring now to FIG. 3A, a simple 6T cell is shown formed from two back-to-back inverters formed by transistors P10, N10 and P11, N11. Pass transistors N12 and N13 couple bitlines BLC and BLT, respectively, to the inverters when wordline wl is asserted, so that the value of the latch formed by the inverters can be set on a write to the cell. In order to disable simulation of the cell of FIG. 3A, an "Ignore Device" directive is set for the gates of each of pass transistors N12 and N13. The Ignore Device directive causes the simulator to treat the device as if it were logically turned off (e.g., for a NFET as if the gate set to ground). However, the device remains in the circuit model with respect to loading characteristics.

Since there are no paths into or out of the cell when transistors N12 and N13 of FIG. 3A are disabled, no internal simulation of the internals of the cell of FIG. 3A is performed within the transistor-level array modeling simulation, but the AC loading effects of the cell are still included, effecting the signals on bitlines BLT, BLC and wordline wl.

Figure 3B:
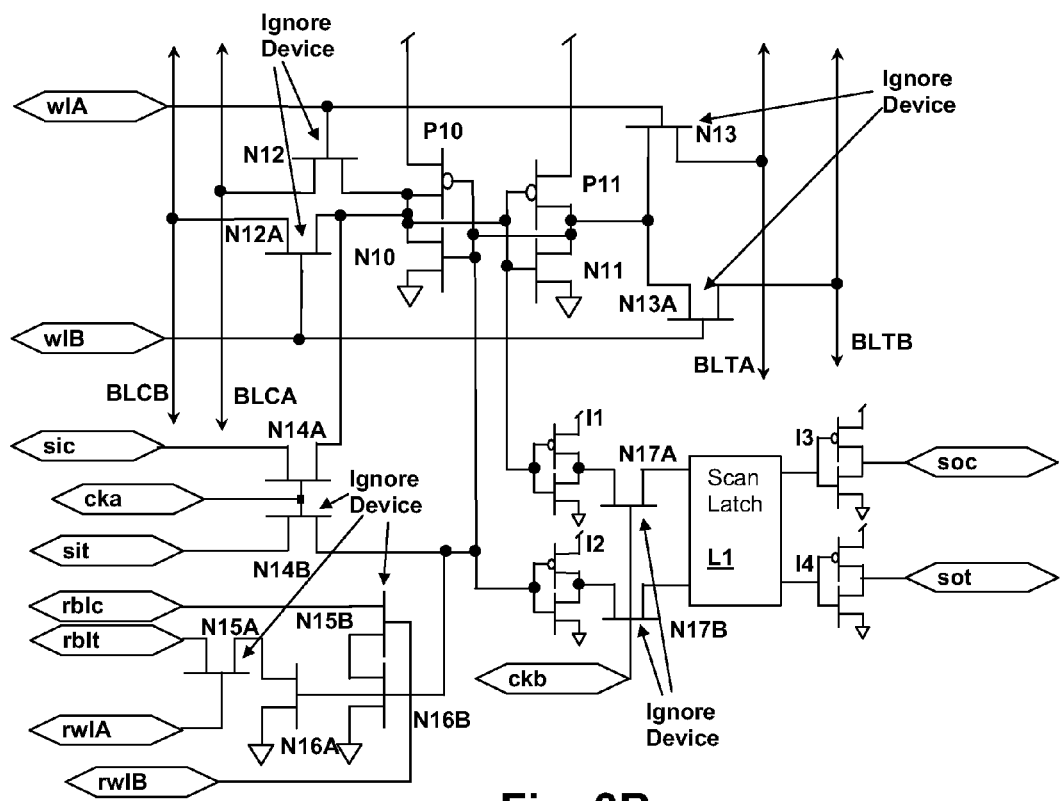

Referring now to FIG. 3B, a more complex scannable memory cell having two data ports is depicted. The elements of the 6T cell described above are included and disabled in the same manner. Additionally, pass transistors N12A and N13A provide a second write port and are also disabled via the Ignore Device directive. Also, dual read ports are provided by N15A, N15B, N16A, N16B and are logically disabled by Ignore Device directives.

The only remaining signal paths that can affect the internal states of the cell of FIG. 3B or cause an effect at an output from the cell are provided through scan circuits. Transistors N14A and N14B provide scan-in values sic and sit when scan clock cka is asserted. The paths through transistors N14A and N14B are logically disabled by Ignore Device directives.

Inverters I1-I4 and scan latch L1 change the scan out signals soc, sot when scan clock ckb activates transistors N17A and N17B. Disabling transistors N17A and N17B via an Ignore Device directive, prevents changes anywhere within the scan latch and output circuits, preventing simulation of those circuits.

The Ignore Device directives mentioned above are set only for non-edge cells in the first static timing analysis pass that simulates only the edge cells. After any outliers in the center of the array are located, the entire array can be disabled except for the outliers in the same fashion, with the non-edge outlier cells fully simulated by removing the Ignore Device directives within those cell models.

Figure 4:
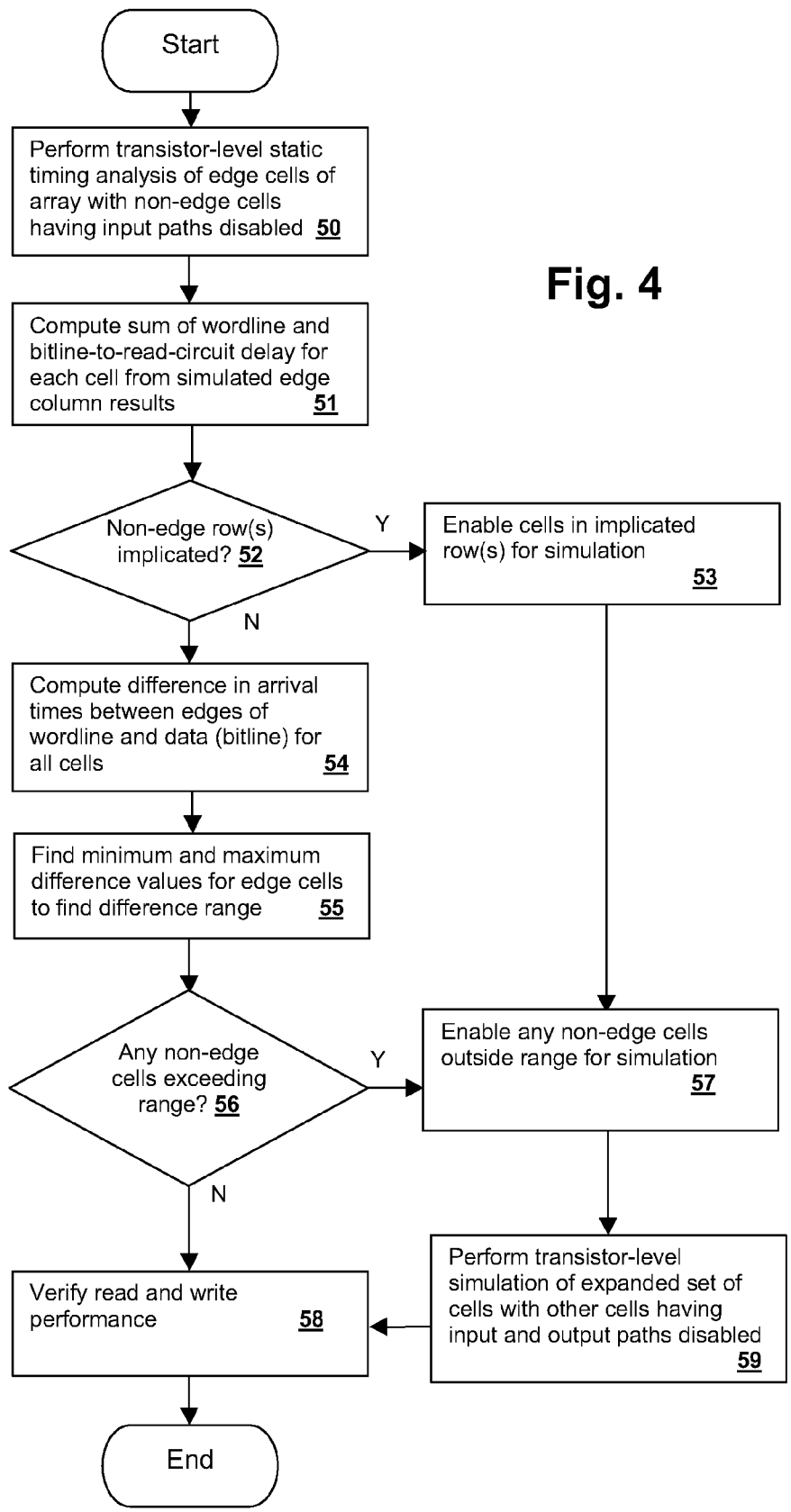
FIG. 4 is a flow chart of a method in accordance with an embodiment of the present invention.

Referring now to FIG. 4, a method in accordance with an embodiment of the present invention is illustrated in a flowchart. First, a transistor-level simulation is performed for all of the edge cells with all of the non-edge cells having pass devices (and other input paths) disabled (step 50). The sum of the wordline edge arrival delays and bitline-to-read-circuit delays are found from the edge column data (step 51). If any non-edge rows are implicated (decision 52), then those rows are enabled for further transistor-level simulation (step 53). Next, differences in arrival of wordline and bitline edges are determined for each cell of the array (step 54) and the maximum and minimum differences for the edge cells determined to find the difference range (step 55). If the difference for any "outlier" non-edge cells exceed the range (decision 56), then those rows are enabled for further transistor-level simulation (step 57). Finally a transistor-level simulation is performed for the additional cells with their input paths enabled, but with other non-edge and optionally the previously-simulated edge cells having input paths disabled (step 59). Finally, read and write performance is verified from edge cell timings and timing of any additional cells/rows (step 58).

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A method for verifying performance of an array design, the method comprising:

specifying a transistor-level model of cells of said array design;

disabling internal simulation of non-edge cells within said array design that are not located along any boundary of a layout of said array design;

simulating said transistor-level model wherein said non-edge cells are included in the loading of signal lines within said array design; and performing a timing analysis of edge cells located at the boundary of the array design to verify said performance by determining at least one of a read and a write timing value, wherein said non-edge cells are included in the loading of signal lines within said array design.

2. The method of claim 1, wherein said array design is a static random access memory (SRAM) array design, and wherein said timing analysis determines at least one of a read delay and a write cycle time.

3. The method of claim 1, further comprising:

determining differences between arrival of a wordline edge and a bitline edge for each cell of the array design, in conformity with a result of said timing analysis;

first determining a greatest and a least of said differences among said edge cells;

second determining whether or not any non-edge cell other than said edge cells have a greater difference than said greatest difference among said edge cells;

third determining whether or not any of said non-edge cells have a lesser difference than said least difference among said edge cells; and responsive to determining that a given other cell has one of a difference greater than said greatest difference and a difference less than said least difference, enabling internal simulation of said given other cell and simulating said given cell via a supplemental transistor-level simulation.

4. The method of claim 3, wherein said array design includes multiple sub-arrays whereby worst-case arrival of said wordline edge and said bitline edge do not occur at edges of said array design, but occur at edges of said sub-arrays, and wherein said specifying, disabling, simulating and performing are repeated for each of said multiple sub-arrays.

5. The method of claim 1, wherein said simulating is performed by a circuit model software package that simulates all circuits in a provided model that have any internal signal variation, and wherein said disabling comprises overriding word line inputs at said non-edge cells of said array design with a directive.

6. The method of claim 5, wherein said overriding is performed by a directive that logically disables all cell pass transistors of said non-edge cells.

7. The method of claim 1, further comprising:

determining wordline arrival delays for each row of said array at a particular column of said array;

determining bitline delays from each cell within said array to a corresponding read circuit;

summing said wordline delay and bitline delay for each of said cells;

finding a greatest and least result of said summing;

determining whether or not at least one of said greatest and least delay correspond to at least one non-edge row of cells of said array; and responsive to determining that said at least one of said greatest and least result of said summing correspond to a particular cell within a non-edge row, enabling internal simulation of said non-edge row of cells and simulating said non-edge row of cells via a supplemental transistor-level simulation.

* * * * *